United States Patent
Pepper et al.

(10) Patent No.: US 9,542,261 B2
(45) Date of Patent: Jan. 10, 2017

(54) METHODS, SYSTEMS, AND COMPUTER READABLE MEDIA FOR MULTI-PACKET CYCLIC REDUNDANCY CHECK ENGINE

(71) Applicant: Ixia, Calabasas, CA (US)

(72) Inventors: Gerald Raymond Pepper, Newbury Park, CA (US); Brian Adam Wilson, Houston, TX (US)

(73) Assignee: Ixia, Calabasas, CA (US)

( * ) Notice: Subject to any disclaimer, the term of this patent is extended or adjusted under 35 U.S.C. 154(b) by 472 days.

(21) Appl. No.: 13/933,105

(22) Filed: Jul. 1, 2013

(65) Prior Publication Data
US 2015/0007003 A1 Jan. 1, 2015

(51) Int. Cl.
*G06F 11/10* (2006.01)
*H03M 13/09* (2006.01)

(52) U.S. Cl.
CPC ........ *G06F 11/1004* (2013.01); *H03M 13/091* (2013.01)

(58) Field of Classification Search
CPC ..... G06F 11/1004; G06F 11/10; G06F 11/104; H03M 13/091; H03M 13/00; H03M 13/05; H03M 13/09; H04L 12/28; H04L 12/56; H04L 1/0061
See application file for complete search history.

(56) References Cited

U.S. PATENT DOCUMENTS

| | | | | |
|---|---|---|---|---|
| 5,778,013 A | * | 7/1998 | Jedwab | 714/807 |
| 6,029,186 A | * | 2/2000 | DesJardins et al. | 708/492 |
| 2004/0062397 A1 | | 4/2004 | Amer | |
| 2009/0086972 A1 | | 4/2009 | Mozak | |
| 2013/0016832 A1 | | 1/2013 | Yamashita | |
| 2014/0281844 A1 | * | 9/2014 | Jiang et al. | 714/807 |
| 2015/0135014 A1 | | 5/2015 | Pepper et al. | |

OTHER PUBLICATIONS

Commonly-assigned, co-pending U.S. Appl. No. 61/900,367 for "Methods, Systems, and Computer Readable Media for Efficient Scrambling of Data for Line Rate Transmission in High Speed Communications Networks," (Unpublished, filed Nov. 5, 2013).
"IEEE Standard for Ethernet," IEEE Std 802.3™-2012 (Revision of IEEE Std 802.3-2008), IEEE, pp. 1-633 (Dec. 28, 2012).
Non-Final Office Action for U.S. Appl. No. 14/535,505 (Aug. 4, 2016).

* cited by examiner

*Primary Examiner* — Albert Decady
*Assistant Examiner* — Enamul M Kabir
(74) *Attorney, Agent, or Firm* — Jenkins, Wilson, Taylor & Hunt, P.A.

(57) ABSTRACT

Methods, systems, and computer readable media for a multi-packet CRC engine are disclosed. According to one aspect, the subject matter described herein includes a system for a multi-packet CRC engine. The system includes an input module for receiving set of bits associated with at least one data packet and identifying packet boundaries within the plurality of bits, multiple CRC pre-calculation blocks (CPBs) that receive from the input module subsets of the set of bits, each subset containing a portion of a packet less than all of a packet, and calculate a CRC value for its respective subset of bits, and an output module for receiving the calculated CRC values from the CPBs and using the calculated CRC values to produce packet-specific CRC values, where the output module is dynamically configurable to combine the calculated CRC values according to the identified packet boundaries to produce packet-specific CRC values.

15 Claims, 10 Drawing Sheets

METHODS, SYSTEMS, AND COMPUTER READABLE MEDIA FOR MULTI-PACKET CYCLIC REDUNDANCY CHECK ENGINE

TECHNICAL FIELD

The subject matter described herein relates to methods and systems for network testing. More particularly, the subject matter described herein relates to methods, systems, and computer readable media for a multi-packet CRC engine.

BACKGROUND

Field programmable gate arrays (FPGAs) are commonly used to implement custom logic in hardware, but current technology FPGAs have a maximum clock rate of about 390 MHz. When FPGAs are used in high-speed network testing equipment, the maximum line rate that this test equipment can handle can be approximated by the equation:

$$\text{bus width} \times \text{FPGA clock frequency} = \text{maximum line rate} \quad (1)$$

For 32 byte (256 bit) buses and 390 MHz clock frequency, the maximum line rate that an FPGA can support is 100 gigabits per second. Although network speeds are increasing, FPGA maximum clock rates are not, which means that, in order to accommodate faster network speeds, network testing equipment must use wider buses. For example, to support 400 gigabits per second line rates, an FPGA having a clock frequency of 390 MHz must use a bus that is 128 bytes (1024 bits) wide.

However, there are disadvantages to using wider buses. One disadvantage is that the FPGA may be processing multiple packets at the same time. As used herein, the terms "packet" and "frame" refer to a collection of data for which its own CRC must be generated. As such, the terms "frame" and "packet" will be used synonymously herein. Even in a pipelined architecture, data from multiple packets may need to be processed during the same clock cycle. Further complicating the process is the fact that the size of each packet may vary. For example, assuming that the minimum frame size is 64 bytes, it is now possible that the FPGA may be processing the end of a first frame, a complete second frame, and the beginning of a third frame during the same clock cycle. This means that the FPGA will need to complete a CRC calculation for the first frame's data, perform an entire CRC calculation for the second frame's data, and begin CRC calculation for the third frame's data simultaneously.

One approach to performing these steps would be to use a single CRC calculation engine and feed that CRC engine the data from the first frame, followed by the data from the second frame, and finally the data from the third frame. This would allow the use of minimum hardware but would be prohibitively time consuming. Another approach would be to have multiple instances of a CRC engine that operates on 64 bytes at a time, but this approach is expensive from a hardware standpoint as well as inefficient, since in most cases only one or perhaps two of the CRC engines would be necessary—the third CRC engine being required only in the scenario described above, in which data from three separate frames is being processed. What is desired is an approach that provides maximum flexibility and performance with minimum hardware cost.

Accordingly, in light of these disadvantages associated with using an FPGA to process multiple frames of data simultaneously, there exists a need for methods, systems, and computer readable media for a multi-packet CRC engine.

SUMMARY

According to one aspect, the subject matter described herein includes a system for a multi-packet CRC engine. The system includes an input module for receiving set of bits associated with at least one data packet and identifying packet boundaries within the plurality of bits, multiple CRC pre-calculation blocks (CPBs) that receive from the input module subsets of the set of bits, each subset containing a portion of a packet less than all of a packet, and calculate a CRC value for its respective subset of bits, and an output module for receiving the calculated CRC values from the CPBs and using the calculated CRC values to produce packet-specific CRC values, where the output module is dynamically configurable to combine the calculated CRC values according to the identified packet boundaries to produce packet-specific CRC values.

According to another aspect, the subject matter described herein includes a method for a multi-packet CRC engine. The method includes, at an entity having hardware for processing network packets, receiving a set of bits associated with at least one data packet and identifying packet boundaries within the set of bits. The set of bits is divided into multiple subsets of bits, each subset containing a portion of a packet less than all of a packet, and a CRC value is calculated for each subset. The calculated CRC values are combined according to identified packet boundaries to produce packet-specific CRC values.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, methods, systems, and computer readable media for a multi-packet CRC engine are provided. Reference will now be made in detail to exemplary embodiments of the present invention, examples of which are illustrated in the accompanying drawings. Wherever possible, the same reference numbers will be used throughout the drawings to refer to the same or like parts.

Figure 1:
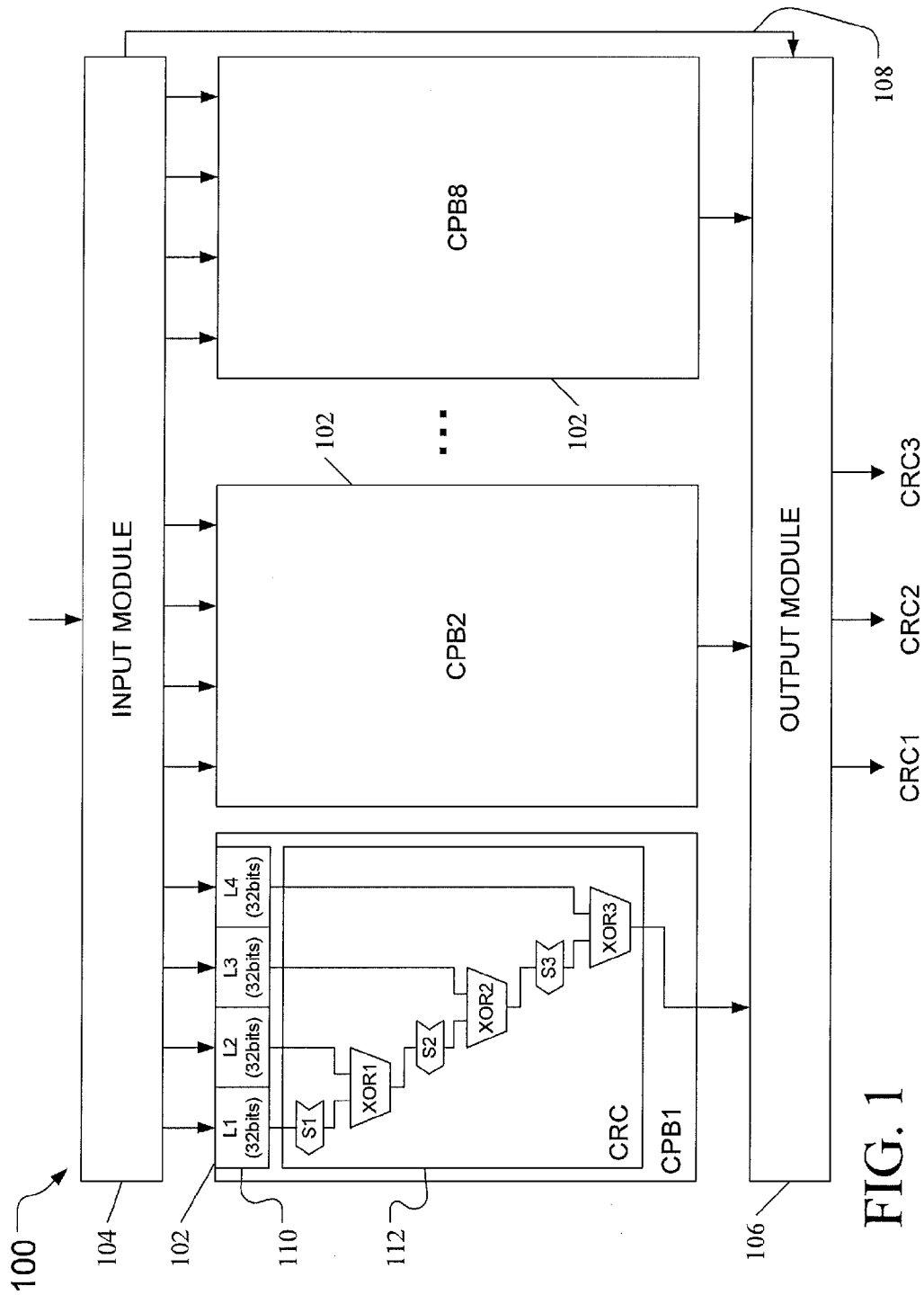
FIG. 1 is a block diagram illustrating a system for performing a multi-packet cyclic redundancy check (CRC) according to an embodiment of the subject matter described herein.

FIG. 1 is a block diagram illustrating a system for performing a multi-packet cyclic redundancy check (CRC) according to an embodiment of the subject matter described herein. In the embodiment illustrated in FIG. 1, system 100 includes a set of CRC pre-calculation blocks (CPBs 102.) Each CPB 102 calculates a CRC value for a set of bits. In the embodiment illustrated in FIG. 1, each CPB 102 receives 16 bytes (128 bits) of data and generates a 32 bit CRC value. In one embodiment, system 100 includes an input module 104 that receives data containing bits from one or more network frames. Input module 104 provides subsets of those bits (e.g., less than a full frame) to each CPB 102. The outputs of the CPBs are provided to an output module 106 that combines the CRC values produced by the CPBs according to detected packet boundaries within the plurality of bits to produce at least one frame-specific or packet-specific CRC. In one embodiment, input module 104 may determine frame boundaries by analysis of the data that it received and convey information about the detected frame boundaries to output module 106 via signals 108. The embodiment illustrated in FIG. 1 makes the simplifying assumption that frame boundaries are aligned to 32 bits, but the methods and systems described herein could be extended to eliminate that requirement, albeit at the cost of additional complexity, e.g., the addition of alignment and padding logic at the boundary between input module 104 and the CPBs 102.

In one embodiment, each CPB 102 includes a set of registers or latches 110 for storing its subset of the input data. In the embodiment illustrated in FIG. 1, each CPB 102 receives a 128-bit subset of data provided by input module 104 and stores that subset into four 32-bit latches (L1-L4.) Each CPB 102 includes CRC logic 112 for generating a CRC value for the 128-bit subset that is being processed by that CPB. In the embodiment illustrated in FIG. 1, CRC logic 112 includes multiple shifters (S1-S3) and exclusive-or circuits (XOR1-XOR3) for calculating the CRC value for the 128-bit subset. For example, the 32-bit value stored in latch L1 is shifted four bytes before being XOR'ed with the 32-bit value stored in latch L2 using XOR1. The output of XOR1 is shifted four bytes and XOR'ed with the 32-bit value stored in latch L3 using XOR2. The output of XOR2 is shifted four bytes and XOR'ed with the 32-bit value stored in latch L4 using XOR3. The 32-bit value produced by XOR3 is the pre-calculated CRC output of the CPB. The CRC pre-calculation steps described herein are intended to be illustrative and not limiting. CPB 102 may perform any steps that produce a CRC output. The pre-calculated CRC outputs produced by the set of CPBs is then provided to output module 106.

Output module 106 combines the pre-calculated CRC values produced by CPBs 102 according to detected packet boundaries within the plurality of bits to produce at least one packet-specific CRC. This is shown in simplified form in FIGS. 2 through 4, which show how the outputs of CPB1 through CPB8 will be combined within output module 106 depending on whether the data stream received by input module 104 and sub-divided into CPB1-8 contained data from three frames, two frames, or one frame, respectively.

Figure 2:
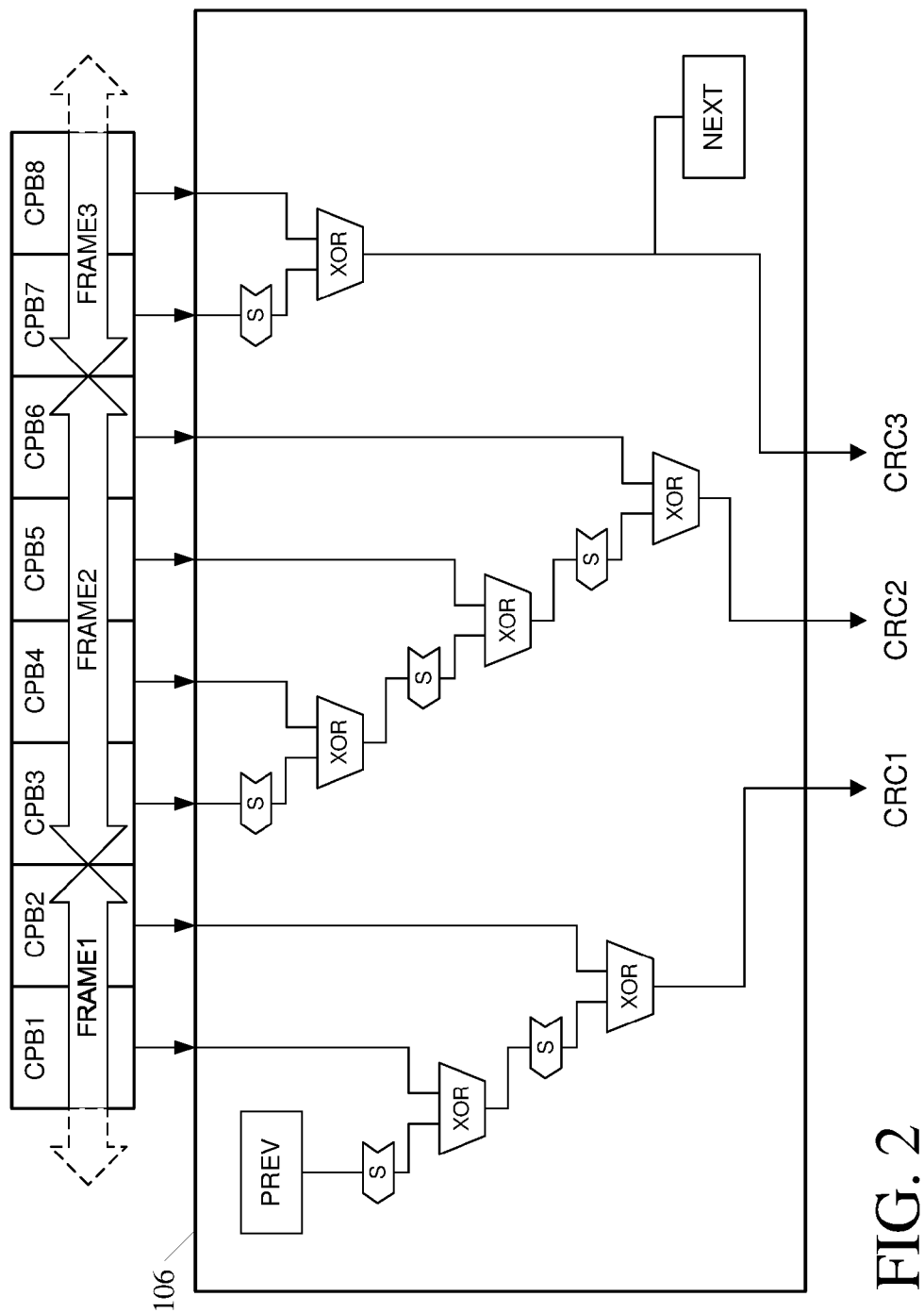
FIGS. 2-4 are block diagrams showing various ways that the system for performing a multi-packet CRC may be configured according to the location of frame boundaries within the input data according to an embodiment of the subject matter described herein.

FIG. 2 is a block diagram illustrating one configuration of output module 106. In the embodiment illustrated in FIG. 2, output module 106 includes multiple shifters (S) and multiple exclusive-or circuits (XOR), which are dynamically configured and reconfigured to operate on the pre-calculated CRC outputs of the CPBs 102 to produce frame-specific CRC values. FIG. 2, for example, illustrates how output module 106 may be configured in the scenario where CPB1 and CPB2 produce pre-calculated CRC values for the end of a first frame, CPB3 through CPB6 produce the pre-calculated CRC values for an entire second frame, and CPB7 and CPB8 produce the pre-calculated CRC values for the beginning of a third frame. In this embodiment, output module 106 has stored the partial CRC that was previously calculated using the first part of frame 1 into a latch for that purpose (PREV). It has been determined that the boundary between frame 1 and frame 2 exists between CBP2 and CPB3 and that the boundary between frame 2 and frame 3 exists between CPB6 and CPB7.

In response to this determination of frame boundaries, output module 106 has been configured to calculate the CRC for the first frame using the values from PREV, CPB1, and CPB2, which is output as CRC1. Output module 106 calculates the CRC for frame 2 using the values from CPB3 through CPB6, which is output as CRC2. Output module 106 calculates a partial CRC for frame 3 using the values in CPB7 and CPB8, which it stores in a latch for that purpose (NEXT). When input module 104 provides new subsets of bits to the CPBs, the value stored in NEXT will be transferred to PREV by output module 106. In one embodiment, the partial CRC may be output as CRC3 for use by other components of the system.

Figure 3:
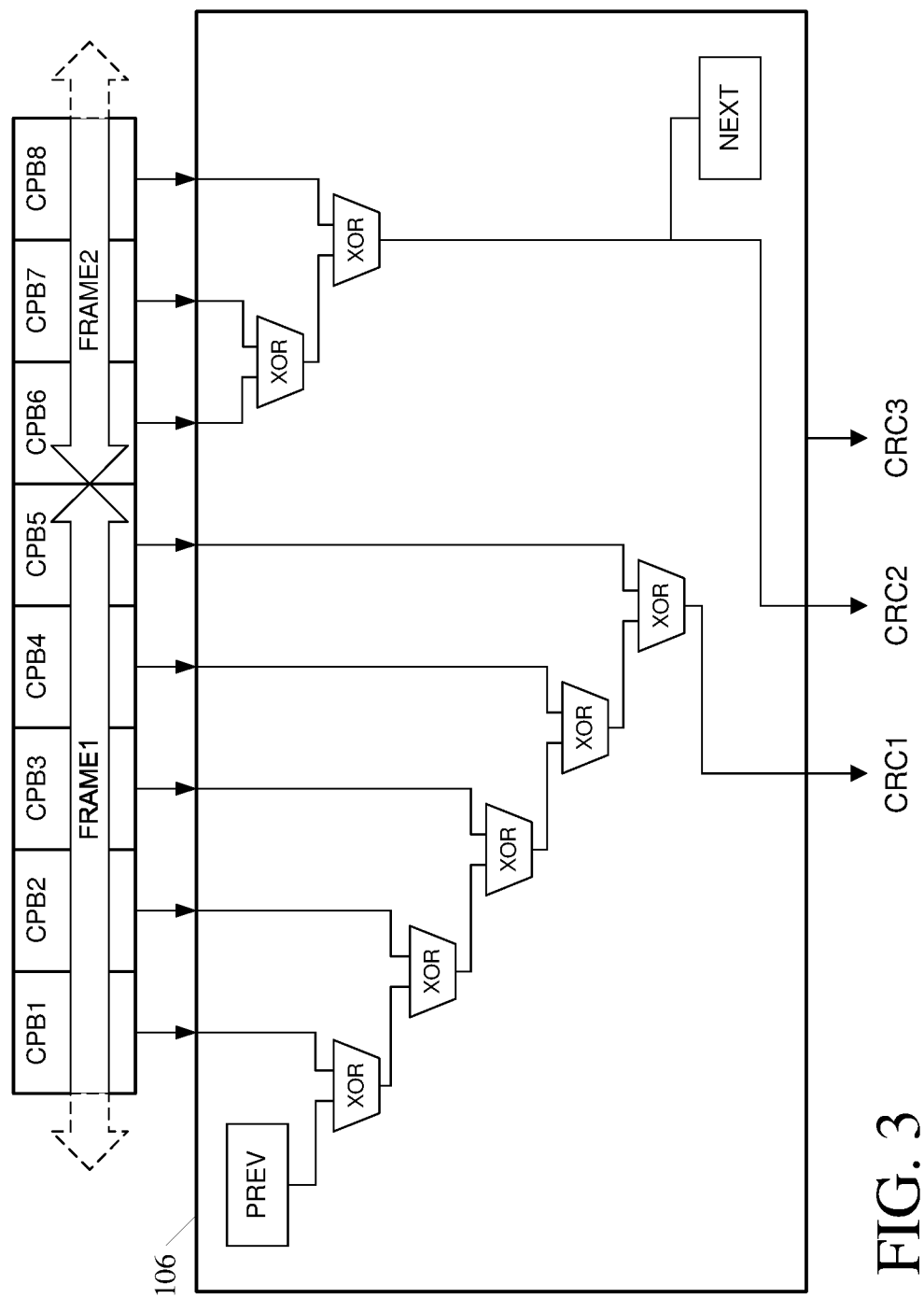

FIG. 3 is a block diagram illustrating how output module 106 may be configured in the scenario where CPB1 through CPB5 produce pre-calculated CRC values for the end of a first frame, and CPB6 through CPB8 produce the pre-calculated CRC values for the beginning of a second frame. In this scenario, output module 106 produces the CRC for frame 1 using values from PREV, CPB1, CPB2, CPB3, CPB4, and CPB5, which is output as CRC1. Output module 106 produces a partial CRC for frame 2 using values from CPB6, CPB7, and CPB8, which is stored in PREV and which is also output as CRC2. It should be noted that although shifters S have been omitted from FIGS. 3 through 9 for clarity, in one embodiment the shift operation is still performed on one of the inputs into each XOR (e.g., the left-side input.)

Figure 4:
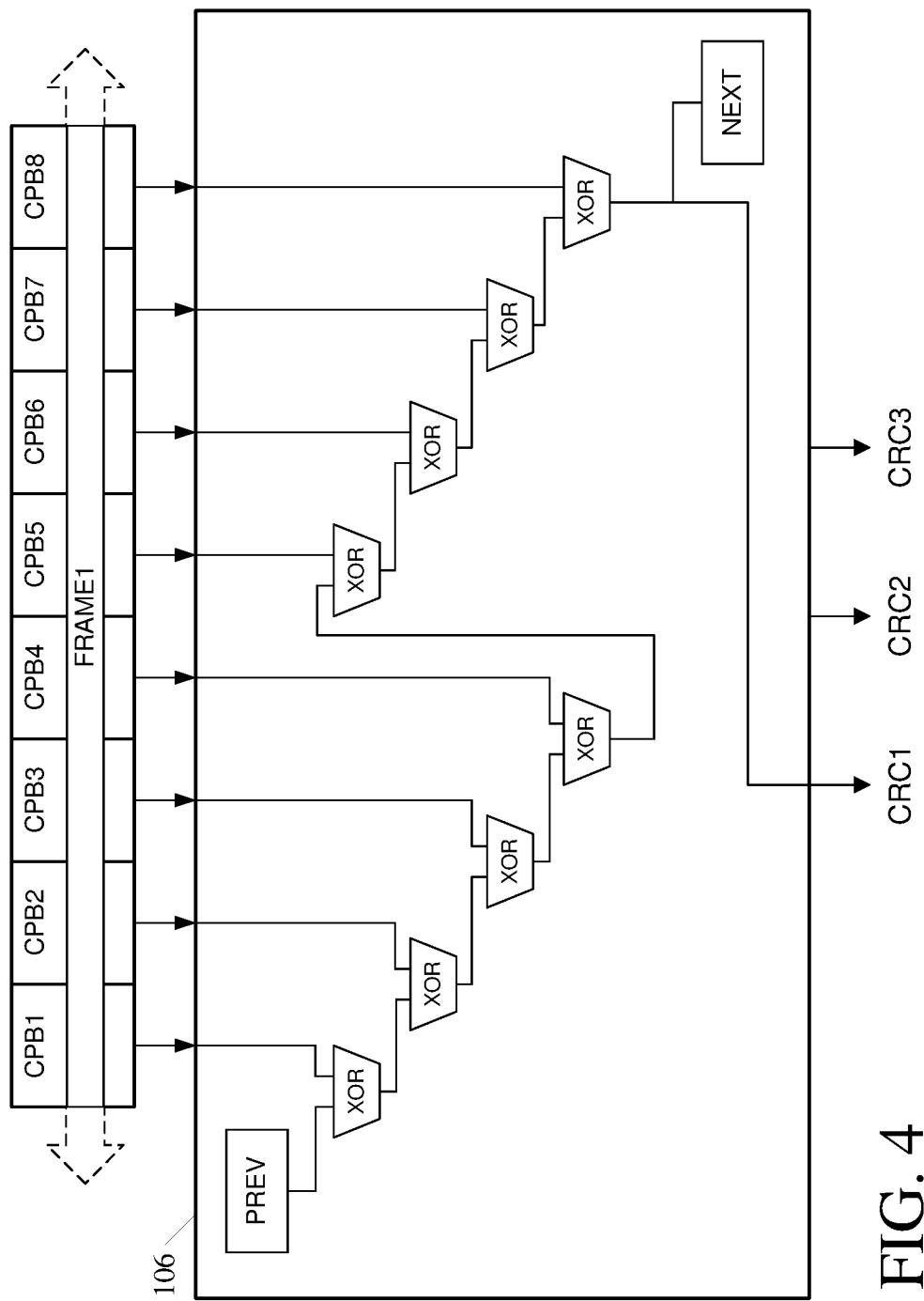

FIG. 4 is a block diagram illustrating how output module 106 may be configured in the scenario where CPB1 through CPB8 are processing the middle of a long frame. In this scenario, output module 106 has previously produced a partial CRC, which has been stored in PREV. Output module 106 produces another partial CRC using the values from PREV, CPB1, CPB2, CPB3, CBP4, CPB5, CPB6, CBP7, and CPB8. There is no detected frame boundary since frame 1 has not terminated yet, so output module 106 stores the updated partial CRC in NEXT, and may optionally output the partial result as CRC1.

The modular design of output module 106 provides the maximum flexibility and performance with minimum hardware cost desired. Every possible scenario—one, two, or three frames—is supported with a limited number of instances of duplicated components, such as the XOR blocks described above. In the embodiments illustrated in FIGS. 2, 3, and 4, for example, only 8 XORs are needed, and at least 6 will always be used, which means that output module 106 always has a high utilization—between 75 and 100 percent.

Figure 5:
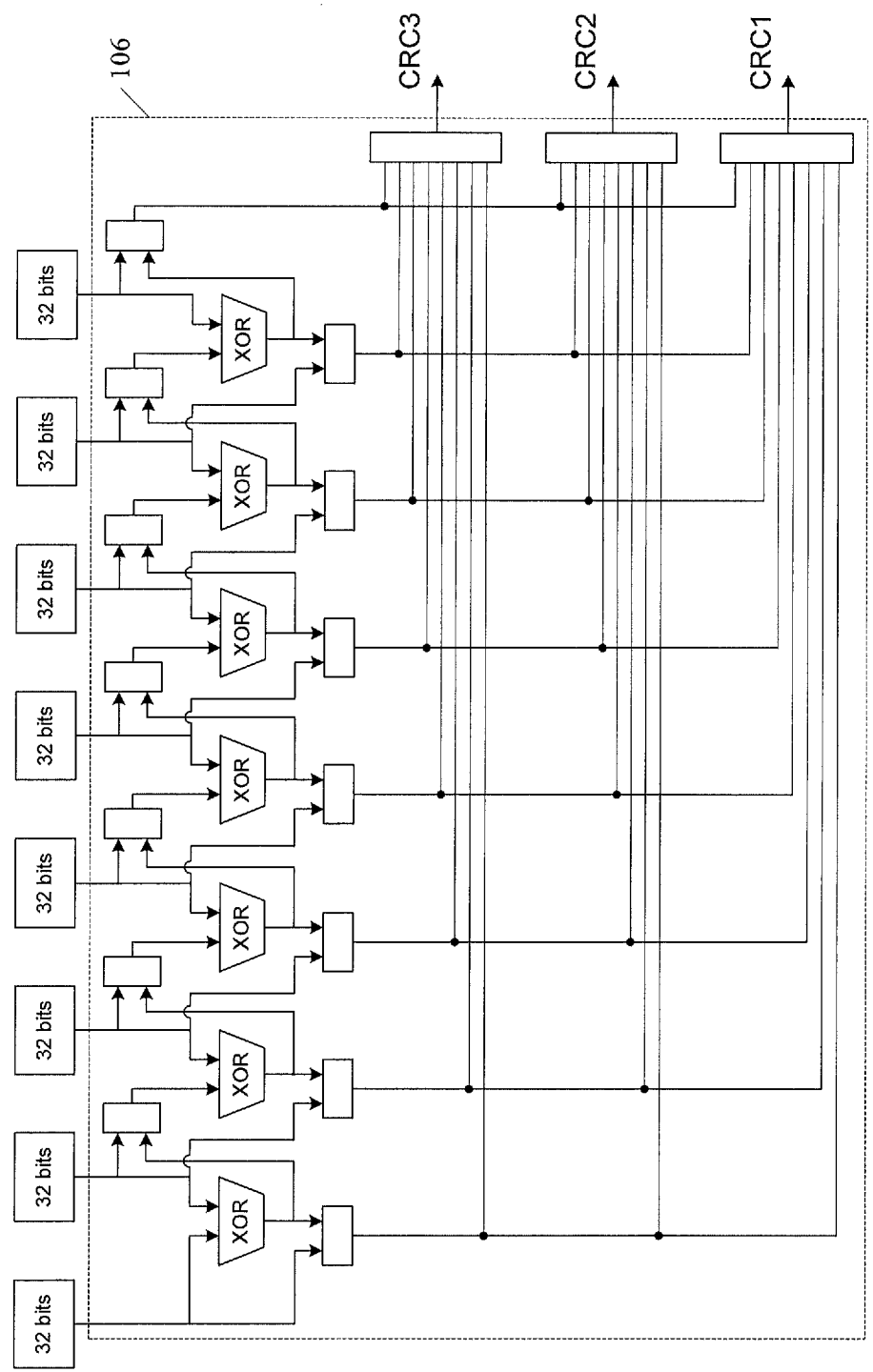
FIG. 5 is a circuit diagram illustrating in more detail a portion of a system for performing a multi-packet CRC according to another embodiment of the subject matter described herein.

FIG. 5 is a circuit diagram illustrating in more detail output module 106 according to another embodiment of the subject matter described herein. In the embodiment illustrated in FIG. 5, output module 106 receives sets of 32-bit pre-calculated CRC data from the CPBs (not shown.) In the circuit diagram illustrated in FIG. 5, rectangles represent select blocks, which select one of the inputs to be the output. The operation of output module 106 can be dynamically configured by controlling the select blocks, as will be shown in FIGS. 6 through 9, below.

Figure 6:
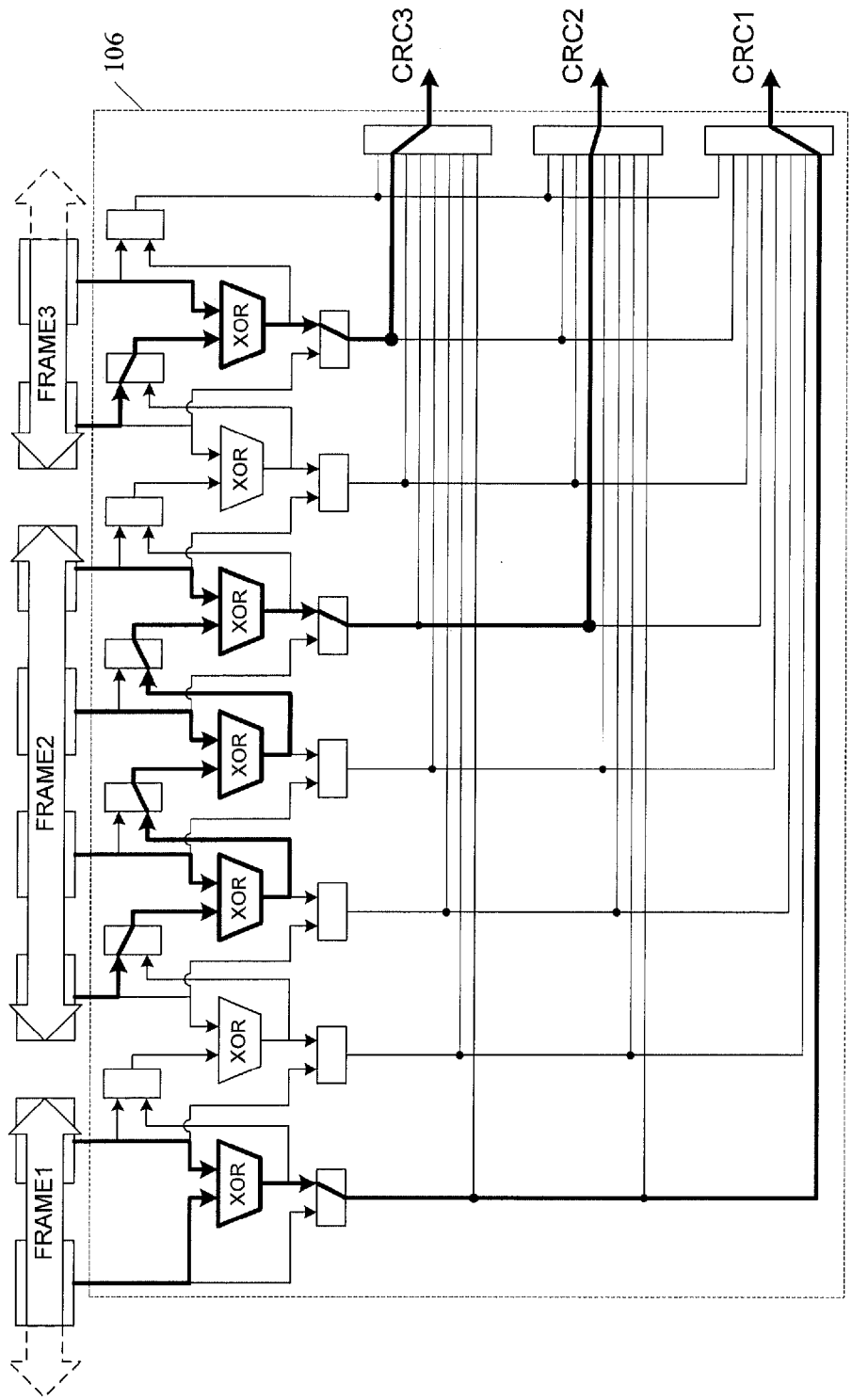
FIGS. 6-9 are circuit diagrams showing various ways that the system for performing a multi-packet CRC may be configured according to the location of frame boundaries within the input data according to an embodiment of the subject matter described herein.
Figure 7:
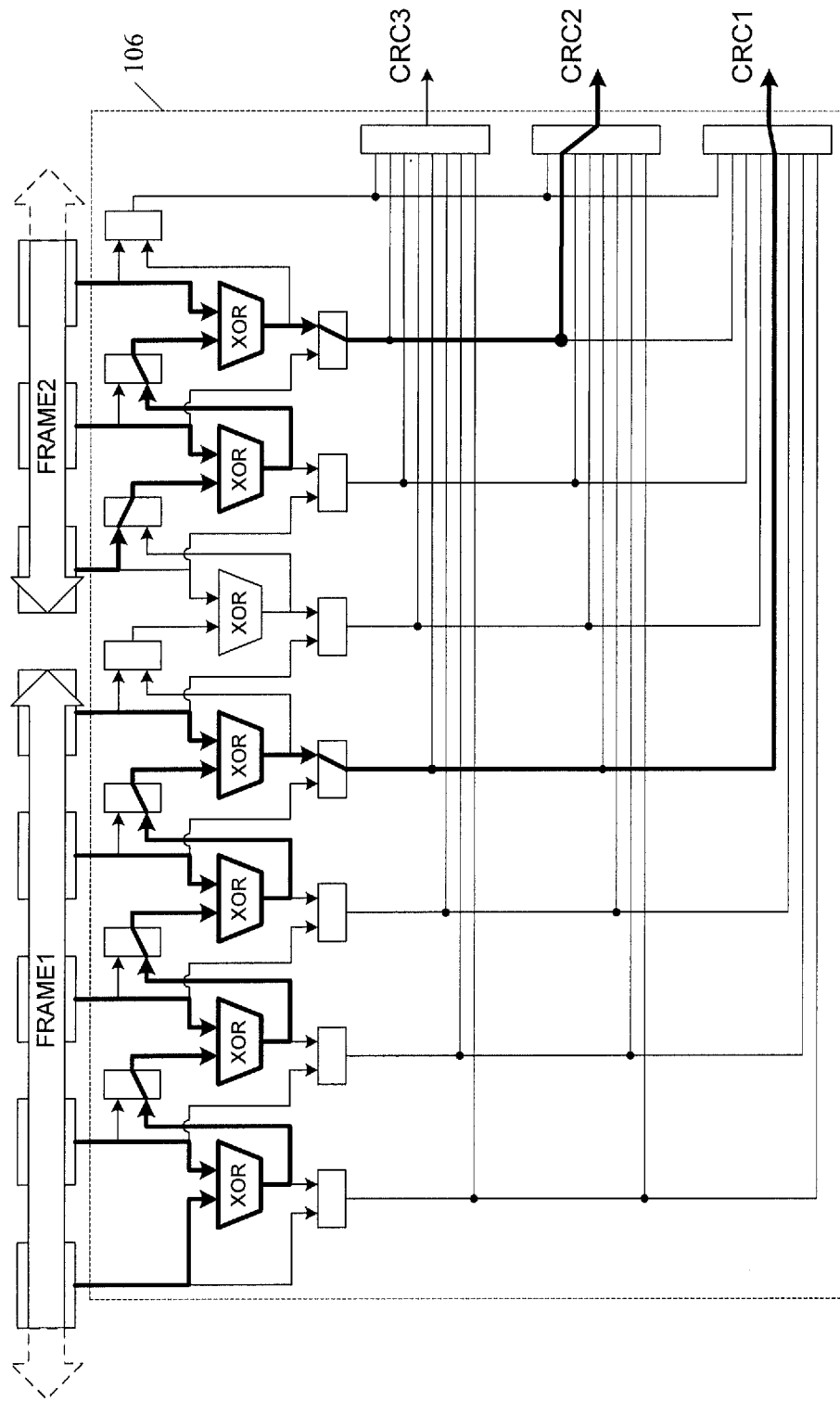
Figure 8:
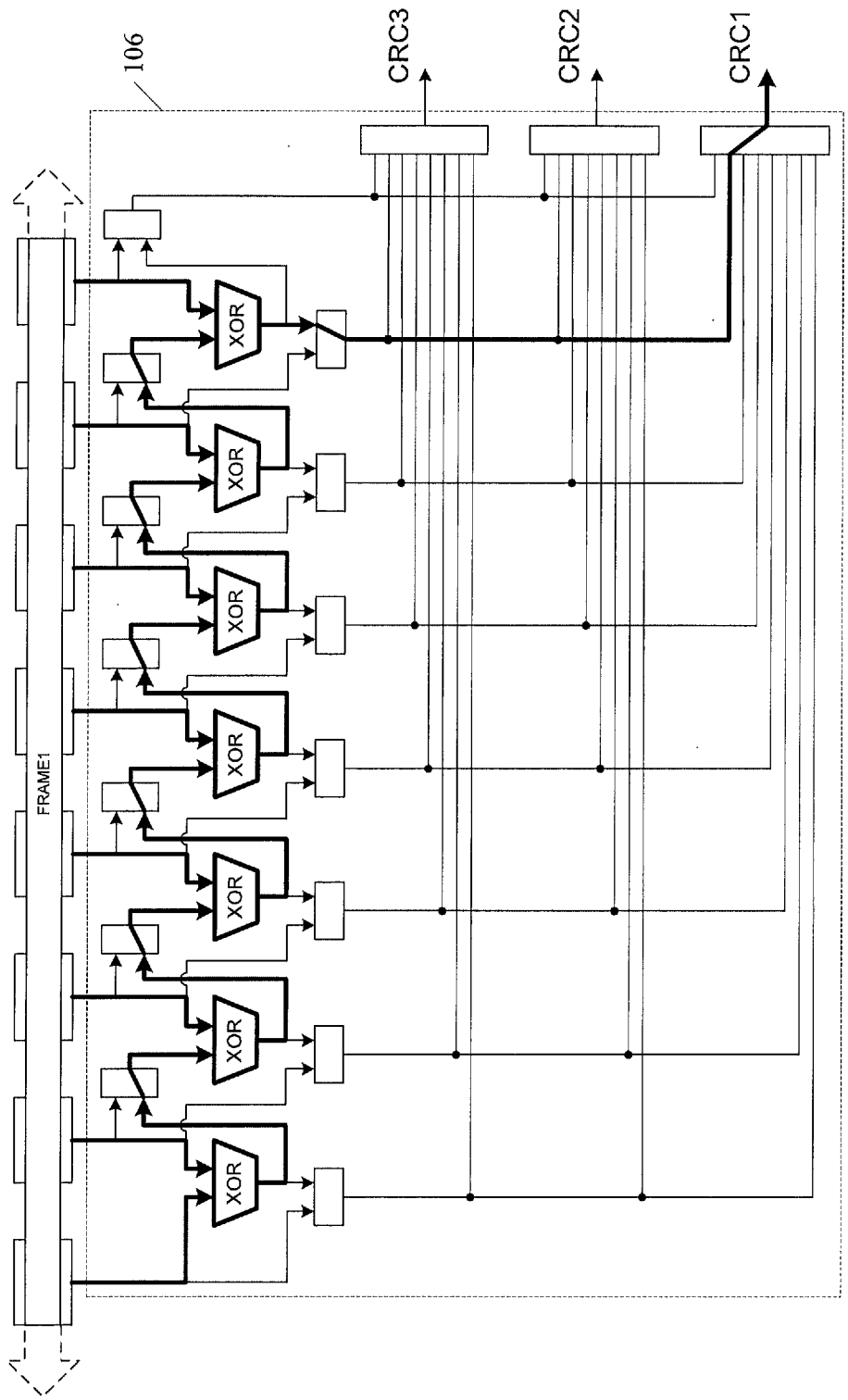
Figure 9:
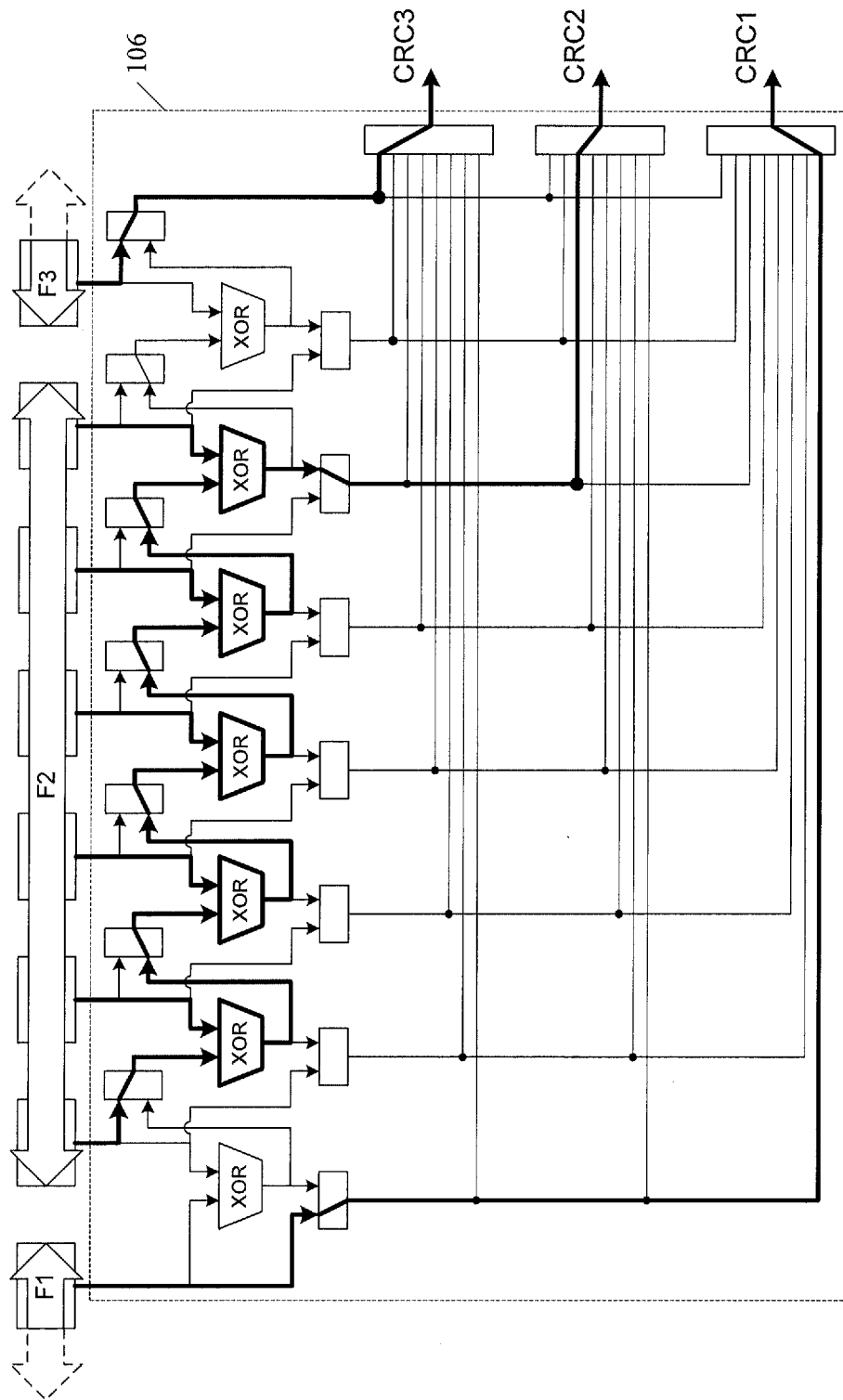

FIG. 6 shows the circuit in FIG. 5 as it would be configured for the scenario described in FIG. 2. FIG. 7 shows the circuit in FIG. 5 as it would be configured for the scenario described in FIG. 3. FIG. 8 shows the circuit in FIG. 5 as it would be configured for the scenario described in FIG. 4. FIG. 9 shows the circuit in FIG. 5 as it would be configured when the frame boundaries are between CPB1 and CPB2 and between CPB7 and CBP8, respectively. In FIGS. 6 through 9, the operations involving PREV and NEXT have been omitted for clarity. It can be seen in FIGS. 6 through 9 that the circuit illustrated in FIG. 5 is flexible enough to handle any allowable configuration of frame boundaries.

Figure 10:
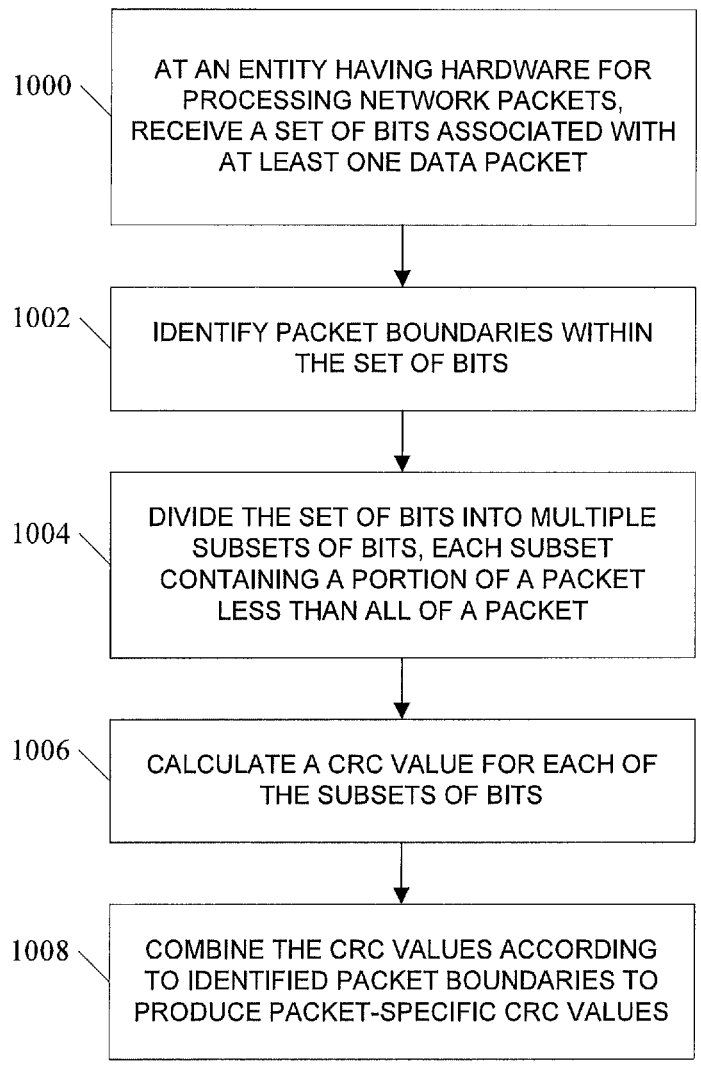
FIG. 10 is a flow chart illustrating an exemplary process for performing a multi-packet CRC according to an embodiment of the subject matter described herein.

FIG. 10 is a flow chart illustrating an exemplary process for performing a multi-packet CRC according to an embodiment of the subject matter described herein. In the embodiment illustrated in FIG. 10, at step 1000, an entity having hardware for processing network packets receives a set of bits associated with at least one data packet. Referring to FIG. 1, for example, input module 104 may receive 128 bytes of data serially or in parallel.

At step 1002, packet boundaries are identified within the set of bits. In one embodiment, for example, input module 104 may analyze the contents of the received data to look for packet headers and footers. Upon detection of a known packet header or footer structure, input module 104 may determine the packet boundaries within the set of bits and provide that information to output module 106.

At step 1004, the set of bits is divided into multiple subsets of bits, each subset containing a portion of a packet less than all of a packet. Referring to FIG. 1, for example, input module 104 divides the 128 byte input into eight 16-byte subsets, which are provided to each of the eight CPBs 102.

At step 1006, a CRC value is calculated for each of the subsets of bits. In FIG. 1, for example, each CPB 102 calculates a CRC value for its respective 16 bytes. In the embodiment illustrated in FIG. 1, each CPB 102 performs multiple calculations on 32 bit chunks. The CRC values calculated by the CPBs 102 are provided to output module 106.

At step 1008, the CRC values are combined according to identified packet boundaries to produce packet-specific CRC values. In FIG. 1, for example, output module 106 may receive information about the location of packet boundaries from input module 104 via signals 108, and may reconfigure its internal data paths accordingly, as illustrated in FIGS. 6-9. Alternatively, input module 104 may directly configure output module 106, or another module or processor within system 100 may receive the boundary information from input module 104 and send configuration commands to output module 106.

It will be understood that various details of the subject matter described herein may be changed without departing from the scope of the subject matter described herein. Furthermore, the foregoing description is for the purpose of illustration only, and not for the purpose of limitation.

What is claimed is:

1. A system for performing a multi-packet cyclic redundancy check (CRC), the system comprising:
    an input module for receiving a plurality of bits associated with at least one data packet and identifying packet boundaries within the plurality of bits;
    a plurality of CRC pre-calculation blocks (CPBs), wherein each CPB receives from the input module a subset of the plurality or bits, each subset containing a portion of a packet less than all of a packet, and calculates a CRC value for its respective subset of bits; and
    an output module for receiving the calculated CRC values from the plurality of CPBs and using the calculated CRC values to produce packet-specific CRC values, wherein the output module is dynamically configurable to combine the calculated CRC values according to the identified packet boundaries to produce packet-specific CRC values and wherein the output module receives information about the locations of the packet boundaries from the input module and reconfigures internal data paths of the output module to direct data within a given set of packet boundaries to be combined with other data from within the same set of packet boundaries;
    wherein the output module comprises a number of instances of duplicated components, and wherein each instance of duplicated components comprises a same number of select blocks and a same number of XOR circuits; and
    wherein the output module is dynamically configurable to combine the calculated CRC values according to the identified packet boundaries to produce packet-specific CRC values by virtue of dynamically controlling the select blocks of the instances of duplicated components.

2. The system of claim 1 wherein the output module inserts the packet-specific CRC values into each of the corresponding at least one data packet.

3. The system of claim 1 wherein each of the CPBs calculates a CRC value using a pipelined architecture.

4. The system of claim 1 wherein each of the CPBs calculates a CRC value using a cascading, hierarchical combinatorial logic structure.

5. The system of claim 1 wherein the output module configures logic circuits within the output module according to the identified packet boundaries.

6. A method for performing a multi-packet cyclic redundancy check (CRC), the method comprising:
    at an entity having hardware for processing network packets:

receiving a plurality of bits associated with at least one data packet;

identifying packet boundaries within the plurality of bits;

dividing the plurality of bits into a plurality of subsets of bits, each subset containing a portion of a packet less than all of a packet;

calculating a CRC value for each of the plurality of subsets of bits; and combining the calculated CRC values according to identified packet boundaries to produce packet-specific CRC values, wherein combining the calculated CRC values according to the identified packet boundaries comprises receiving, at an output module, information about the locations of the packet boundaries from an input module and reconfiguring internal data paths of the output module to direct data within a given set of packet boundaries to be combined with other data from within the same set of packet boundaries;

wherein the output module comprises a number of instances of duplicated components, and wherein each instance of duplicated components comprises a same number of select blocks and a same number of XOR circuits; and wherein reconfiguring internal data paths of the output module to direct data within a given set of packet boundaries to be combined with other data from within the same set of packet boundaries comprises dynamically controlling the select blocks of the instances of duplicated components.

7. The method of claim 6 comprising inserting the packet-specific CRC values into the corresponding packets.

8. The method of claim 6 wherein calculating a CRC value for each of the plurality of subsets of bits comprises using a pipelined architecture.

9. The method of claim 6 wherein calculating a CRC value for each of the plurality of subsets of bits comprises using a cascading, hierarchical combinatorial logic structure.

10. The method of claim 6 wherein combining the calculated CRC values according to identified packet boundaries to produce packet-specific CRC values comprises using the output module, which dynamically configures the data paths and logic circuits within the output module according to the identified packet boundaries to produce the packet-specific CRC values.

11. A non-transitory computer readable medium having stored thereon executable instructions that when executed by the processor of a computer control the computer to perform steps comprising:

at an entity for generating network packets and having hardware:

receiving a plurality of bits associated with at least one data packet;

identifying packet boundaries within the plurality of bits;

dividing the plurality of bits into a plurality of subsets of bits, each subset containing a portion of a packet less than all of a packet;

calculating a CRC value for each of the plurality of subsets of bits; and combining the calculated CRC values according to identified packet boundaries to produce packet-specific CRC values, wherein combining the calculated CRC values according to the identified packet boundaries comprises receiving, at an output module, information about the locations of the packet boundaries from an input module and reconfiguring internal data paths of the output module to direct data within a given set of packet boundaries to be combined with other data from within the same set of packet boundaries;

wherein the output module comprises a number of instances of duplicated components, and wherein each instance of duplicated components comprises a same number of select blocks and a same number of XOR circuits; and wherein reconfiguring internal data paths of the output module to direct data within a given set of packet boundaries to be combined with other data from within the same set of packet boundaries comprises dynamically controlling the select blocks of the instances of duplicated components.

12. The non-transitory computer readable medium of claim 11 for performing steps comprising inserting the packet-specific CRC values into the corresponding packets.

13. The non-transitory computer readable medium of claim 11 wherein calculating a CRC value for each of the plurality of subsets of bits comprises using a pipelined architecture.

14. The non-transitory computer readable medium of claim 11 wherein calculating a CRC value for each of the plurality of subsets of bits comprises using a cascading, hierarchical combinatorial logic structure.

15. The non-transitory computer readable medium of claim 11 wherein combining the calculated CRC values according to identified packet boundaries to produce packet-specific CRC values comprises using the output module, which dynamically configures the data paths and logic circuits within the output module according to the identified packet boundaries to produce the packet-specific CRC values.

* * * * *